(12) United States Patent
Akiya

(10) Patent No.: US 6,559,725 B1
(45) Date of Patent: May 6, 2003

(54) PHASE NOISE REDUCTION SYSTEM FOR FREQUENCY SYNTHESIZER AND METHOD THEREOF

(75) Inventor: Makoto Akiya, Saitama (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/611,084

(22) Filed: Jul. 6, 2000

(30) Foreign Application Priority Data

Jul. 6, 1999 (JP) ............................................. 11-192402

(51) Int. Cl.[7] ............................. H03L 7/089; H03L 7/18
(52) U.S. Cl. ................... 331/1 A; 331/25; 331/DIG. 2; 327/156; 327/159; 375/376
(58) Field of Search ..................... 331/1 A, 25, DIG. 2; 327/156, 159; 375/376

(56) References Cited

U.S. PATENT DOCUMENTS 5,128,632 A * 7/1992 Erhart ......................... 331/1 A
5,420,545 A * 5/1995 Davis et al. .................. 331/17

FOREIGN PATENT DOCUMENTS

JP              7-297712         11/1995

* cited by examiner

Primary Examiner—Arnold Kinkead
(74) Attorney, Agent, or Firm—Dickstein, Shapiro, Morin & Oshinsky, LLP.

(57) ABSTRACT

A phase noise reduction system of a frequency synthesizer for obtaining an arbitrary frequency oscillation by locking a reference oscillation frequency of a reference oscillator to an oscillation frequency of a voltage controlled oscillator has a variable frequency divider for voltage controlled oscillator which divides an oscillation frequency of the voltage controlled oscillator, a variable frequency divider for reference oscillator which divides a reference oscillation frequency of the reference oscillator, and a lock detection section which initially sets a common small number of frequency division to the variable frequency divider for voltage controlled oscillator and the variable frequency divider for reference oscillator, respectively, subsequently detects locking of frequency, and switches the setting of number of frequency division from the small number of frequency division to a larger number of frequency division. The phase noise reduction system is capable of switching to a state of better phase noise in a shorter period of time thus enabling a high-speed locking.

5 Claims, 3 Drawing Sheets

←COUNT NUMBER : 100→

PHASE NOISE REDUCTION SYSTEM FOR FREQUENCY SYNTHESIZER AND METHOD THEREOF

BACKGROUND OF THE INVENTION

The present invention relates to a frequency synthesizer, and in particular, it relates to a phase noise reduction system of a frequency synthesizer and a method thereof.

DESCRIPTION OF THE RELATED ART

As to a prior art example for the frequency synthesizer there is the one disclosed in Japanese Patent Application Laid-Open No. 7-297712. In the disclosed frequency synthesizer, a reference frequency and a number of frequency division of a loop are switched at the same time.

That is to say, initially, it is set such that the reference frequency is large and the number of frequency division of the loop is small, and after a predetermined period of time, it is switched such that the reference frequency becomes small and the number of frequency division of the loop becomes large.

The purpose of initially setting the reference frequency large and the number of frequency division of the loop small is to shorten the time for frequency locking.

Furthermore, the reason of switching such that the reference frequency becomes small and the number of frequency division of the loop becomes large is that if the reference frequency is large, the dissipation current can be increased at a phase comparator.

In such conventional frequency synthesizer, however, since the number of frequency division is switched from small to large when a predetermined period of time passes after the frequency is locked, the number of frequency division has to be kept small for a certain period of time. Under such state where the division number is small, oscillation wave with bad (high) phase noise can be outputted.

Consequently, it has been a problem that it takes long to reach the state where the number of frequency division is large and the phase noise is good (low).

SUMMARY OF THE INVENTION

It is therefore, an object of the present invention to provide a phase noise reduction system of a frequency synthesizer and a method thereof, which are capable of switching within a shorter period of time to a state where phase noise is good, thus enabling a high-speed locking.

In accordance with one aspect of the present invention, there is provided a phase noise reduction system of a frequency synthesizer for obtaining an arbitrary frequency oscillation by locking an oscillation frequency of a voltage controlled oscillator to a reference oscillation frequency of a reference oscillator, comprising: a variable frequency divider for voltage controlled oscillator which divides an oscillation frequency of said voltage controlled oscillator; a variable frequency divider for reference oscillator which divides a reference oscillation frequency of said reference oscillator; and a lock detection section which initially sets a common small number of frequency division to said variable frequency divider for voltage controlled oscillator and said variable frequency divider for reference oscillator, respectively, subsequently detects locking of frequency, and switches the setting of number of frequency division from said small number of frequency division to a larger number of frequency division.

Therefore, in this system, the oscillation frequency of the voltage controlled oscillator and the reference oscillation frequency of the reference oscillator are frequency-divided by a smaller number of frequency division, respectively, by which two comparison frequencies are obtained. Then as the system detects that the two comparison frequencies have the same polarity, the number of frequency division is switched from the smaller number of frequency division to the larger number of frequency division. Accordingly, the time during which the phase noise is bad (high) and the number of frequency division is small is shortened.

On the basis of the result of monitoring polarities of both the output signal from the variable frequency divider for voltage controlled oscillator and the output signal from the variable frequency divider for reference oscillator, the lock detection section determines that the frequency is locked when the polarities of both output signals are maintained the same polarity for a predetermined period of time. In accordance with this system, therefore, immediate determination of a frequency lock is possible.

The lock detection section measures the predetermined period of time while taking the output signal from the reference oscillator as a clock signal. In this case, the predetermined period of time is determined giving consideration to shortening of time for switching and preventing false operation.

Furthermore, there is provided an exclusive OR circuit for monitoring polarities of both the output signal from the variable frequency divider for voltage controlled oscillator and the output signal from the variable frequency divider for reference oscillator.

In this system, therefore, immediate detection of frequency lock is made possible.

In accordance with another aspect of the present invention, there is provided a phase noise reduction system of a frequency synthesizer for obtaining an arbitrary frequency oscillation, comprising: a reference oscillator for oscillating a reference oscillation frequency; a voltage controlled oscillator for varying an oscillation frequency by an input DC voltage and locking said oscillation frequency to the reference oscillation frequency of said reference oscillator; a variable frequency divider for voltage controlled oscillator which divides the oscillation frequency of said voltage controlled oscillator; a variable frequency divider for reference oscillator which divides the reference oscillation frequency of said reference oscillator; a phase comparison DC voltage generating section for generating an input DC voltage of said voltage controlled oscillator such that a phase error between a comparison frequency from said variable frequency divider for voltage controlled oscillator and a comparison frequency from said variable frequency divider for reference oscillator becomes small; and a lock detection section which initially sets a common small number of frequency division to said variable frequency divider for voltage controlled oscillator and said variable frequency divider for reference oscillator, respectively, subsequently detects locking of frequency, and switches the setting of number of frequency division from said small number of frequency division to a larger number of frequency division.

In accordance with the present invention, therefore, two comparison frequencies are obtained as the oscillation frequency from the voltage controlled oscillator and the reference oscillation frequency from the reference oscillator are divided by the smaller number of frequency division. Then as it is detected that the polarities of the comparison frequencies have become the same, the number of frequency division is switched from the smaller one to the larger one. Consequently, the time in which the number of frequency division is small and the phase noise is bad (high) is shortened.

In accordance with still another aspect of the present invention, there is provided a phase noise reduction method of a frequency synthesizer for obtaining an arbitrary frequency oscillation by locking an oscillation frequency of a voltage controlled oscillator to a reference oscillation frequency of a reference oscillator, comprising the steps of: initially frequency-dividing the oscillation frequency of said voltage controlled oscillator and the reference oscillation frequency of said reference oscillator, respectively, by a common small number of frequency division; detecting a lock of said frequency being frequency-divided; and after detecting the lock of said frequency, switching the frequency division by said small number of frequency division to the frequency division by a larger number of frequency division.

Likewise, in accordance with the present invention, two comparison frequencies are obtained as the oscillation frequency from the voltage controlled oscillator and the reference oscillation frequency from the reference oscillator are divided by the smaller number of frequency division. Then as it is detected that the polarities of the comparison frequencies have become the same, the number of frequency division is switched from the smaller one to the larger one. Consequently, the time in which the number of frequency division is small and the phase noise is bad (high) is shortened.

BRIEF DESCRIPTION OF THE DRAWINGS

The above and further objects and the novel feature of the invention will ore fully appear from the following detailed description when the same is read in connection with the accompanying drawings, in which.

DESCRIPTION OF THE PREFERRED EMBODIMENT

Figure 1:
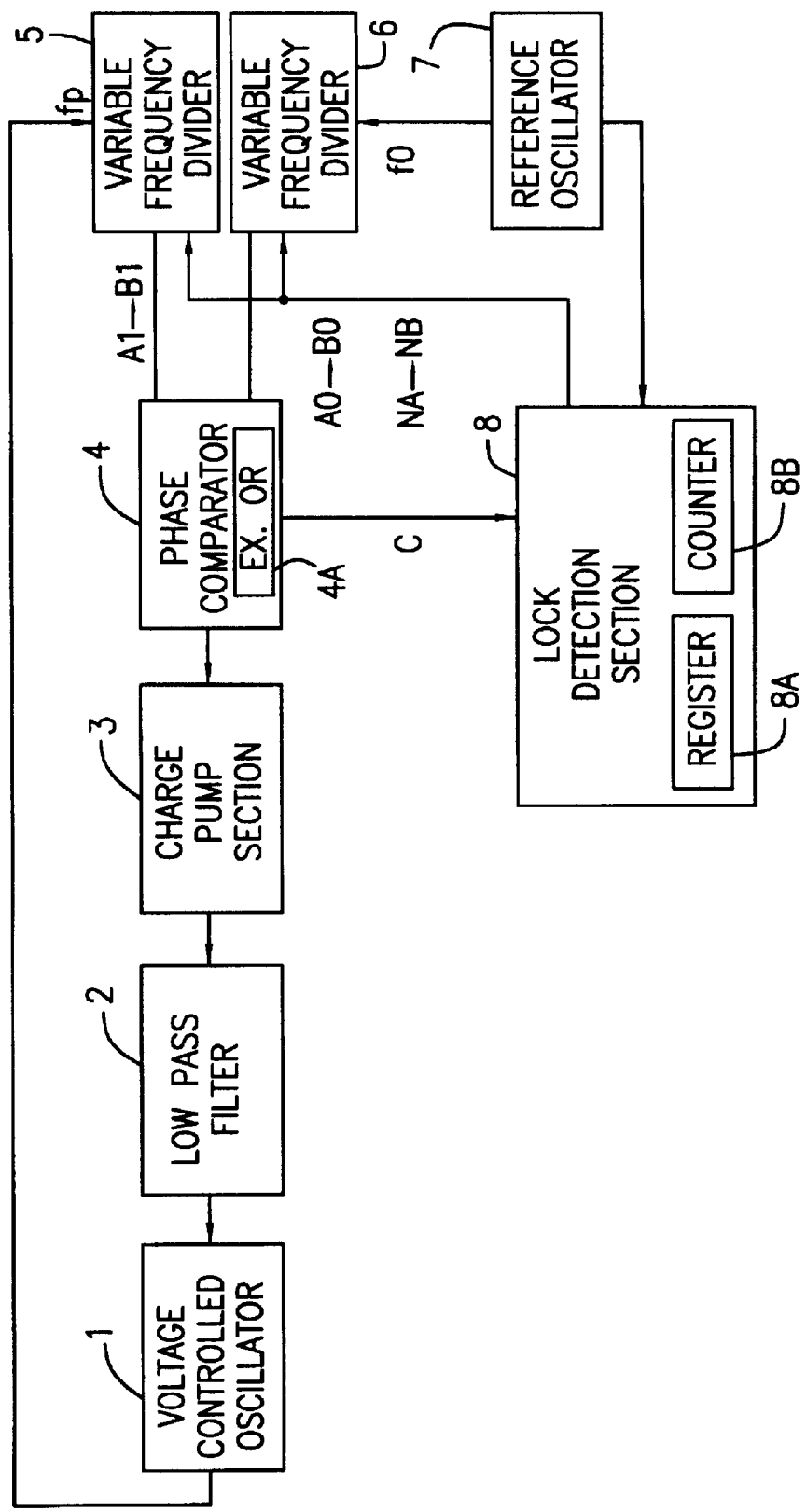
FIG. 1 is a block diagram showing a schematic structure of a phase noise reduction system of a frequency synthesizer in accordance with the present invention.

Referring now to the drawings, a description of a preferred embodiment of the present invention will be given in detail.

FIG. 1 is a block diagram showing a schematic structure of a phase noise reduction system of a frequency synthesizer in accordance with the present invention.

As it is shown in FIG. 1, in the phase noise reduction system of the frequency synthesizer of a PLL (Phase Lock Loop), a VCO (Voltage Controlled Oscillator) I is provided to make the oscillation frequency variable by the input DC voltage. An output of the voltage controlled oscillator 1 is connected to a variable frequency divider 5. The variable frequency divider 5 serves to frequency-divide a frequency fp, which is being oscillated by the voltage controlled oscillator 1, to a comparison frequency.

The system is also provided with a reference oscillator 7 for generating a clock signal with a reference frequency f0.

An output of the reference oscillator 7 connected to a variable frequency divider 6. The variable frequency divider 6 serves to frequency-divide the reference frequency f0, which is being oscillated by e reference oscillator 7, to a comparison frequency.

The outputs of the frequency dividers 5 and 6 are connected to a phase comparator 4, respectively. At the phase comparator 4, phases of two comparison frequencies from the frequency dividers 5 and 6 are compared in order to detect any phase error. The phase comparator 4 is provided with an exclusive OR (EX-OR) circuit 4A.

The output of the phase comparator 4A is connected to a charge pump section 3. The charge pump section 3 serves to input a signal with phase error information being a detection result from the phase comparator 4.

The output of the charge pump section 3 is connected to a low pass filter (LPF) 2. The low pass filter 2 is constructed with a low pass RC circuit. A circuit constant of the low pass filter 2 is determined beforehand on the basis of response characteristics, attenuation characteristics of a leak wave with respect to comparison frequencies up to the previous stage, and so forth.

The charge pump section 3 sets a charging voltage and a discharge voltage such that there will be no phase error with respect to a capacitor of the low pass filter 2. The output of the low pass filter 2 is connected to the input of the voltage controlled oscillator 1. An oscillation frequency of the voltage controlled oscillator 1 is locked to a desired frequency by a low pass filter 2.

A lock detection section 8 is connected to the outputs of the phase comparator 4 and the reference oscillator 7. The lock detection section 8 includes a register 8A and a counter 8B.

The register 8A and the counter 8B of the lock detection section possess numbers of frequency division NA, NB and so forth. In this case, the number of frequency division NA is smaller than the number of frequency division NB, i.e., NA<NB.

Under a frequency division by the smaller number of frequency division NA, a phase noise of a comparison frequency is bad (high), while under a frequency division by the larger number of frequency division NB, a phase noise of a frequency division is good (low).

The register 8A sets a smaller number of frequency division NA to variable frequency dividers 5 and 6.

The counter 8B of the lock detection section 8 receives signals having comparison frequencies of the variable frequency dividers 5 and 6 through the exclusive OR circuit 4A of the phase comparator 4. During the time in which polarities of the signals with the comparison frequencies are the same, the counter 8B counts the clock signals from the reference oscillator 7.

When the counter 8B counts up to a predetermined count number, the lock detection section 8 determines that locking is completed. Consequently, it is possible to shorten the time for locking. The predetermined count number is determined giving consideration to a time to be shortened and a prevention of false operation.

When the locking is completed, the register 8A of the lock detection section 8 sets the larger number of frequency division NB to the variable frequency dividers 5 and 6. Therefore, an immediate switching to the larger number of frequency division NB with a less phase noise can be implemented.

Although it may be generally simple, a loop natural frequency ω n of a transfer function with respect to the loop of the PLL frequency synthesizer can be obtained through the following expression:

ω n=(Kφ *KV/N*t)$^{1/2}$

T* ω n=x

K φ: loop gain

KV: voltage sensitivity

N: number of frequency division

T: lock time

X: dumping factor t: time constant of LPF

Therefore, it is possible to see how the lock time T for a rapid converge on a desired frequency can become short, the smaller the number of frequency division is, i.e., the larger the comparison frequency is.

Next, at the time of frequency setting initialization, in case when the register 8A of the lock detection section 8 sets the smaller number of frequency division NA to the variable frequency dividers 5 and 6, a comparison frequency of an output signal A1 of the variable frequency divider 5 is assumed as fA1 and a comparison frequency of an output signal A0 of the variable frequency divider 6 is assumed as fA0. In this case, fA1 and fA0 become as follows:

fA1=fp/NA fA0=f0/NA

Figure 2A:
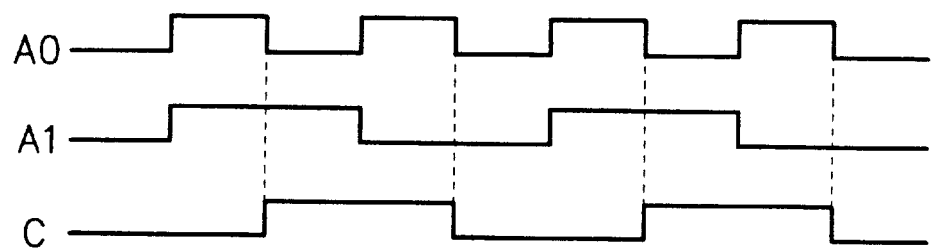
FIG. 2A is a diagram showing an example of operation with respect to an exclusive OR circuit 4A of a phase comparator 4 at a time of initial frequency setting.
Figure 2B:
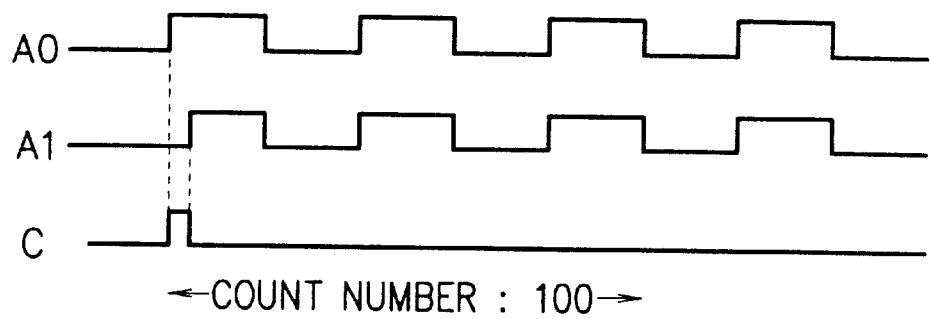
FIG. 2B is another diagram showing an example of operation with respect to the exclusive or circuit 4A of the phase comparator 4 at a time of initial frequency setting.

FIG. 2A and FIG. 2B are diagrams showing an example of operation with respect to an exclusive OR circuit 4A of a phase comparator 4 at a time of initial frequency setting.

As shown in FIG. 2A, at the setting of the smaller number of frequency division NA, there will be a phase error between the output signal A1 from the variable frequency divider 5 and the output signal A0 from the variable frequency divider 6. Due to this phase error, an output signal C is generated from the exclusive OR circuit 4A of the phase comparator 4.

In case when the output signal A1 and the output signal A0 have different polarities, the output signal C becomes a H (high) signal. On the other hand, when the output signal A1 and the output signal A0 have the same polarity, the output signal C becomes a L (low) signal.

As shown in FIG. 2B, when the phase error between the output signal A1 and the output signal A0 become none, both signals will have the same polarity, and the output signal C becomes consecutively the L signal.

Furthermore, once the output signal C becomes of the L level, the counter 8B of the lock detection section 8 starts counting the clock signals from the reference oscillator 7. For instance, once the count number reaches 100 clocks, the lock detection section 8 determines that locking is completed. Then as described above, as the locking is completed, it is switched from the number of frequency division NA to the number of frequency division NB.

Next, at the time of frequency setting initialization, in case when the register 8A of the lock detection section 8 sets the larger number of frequency division NB to the variable frequency dividers 5 and 6, it is assumed that a comparison frequency of the output signal B1 of the variable frequency divider 5 is fB1 and a comparison frequency of the output signal B0 of the variable frequency divider 6 is fB0. In this case, fB1 and fB0 become as follows:

fB1=fp/NB fB0=f0/NB

Figure 3:
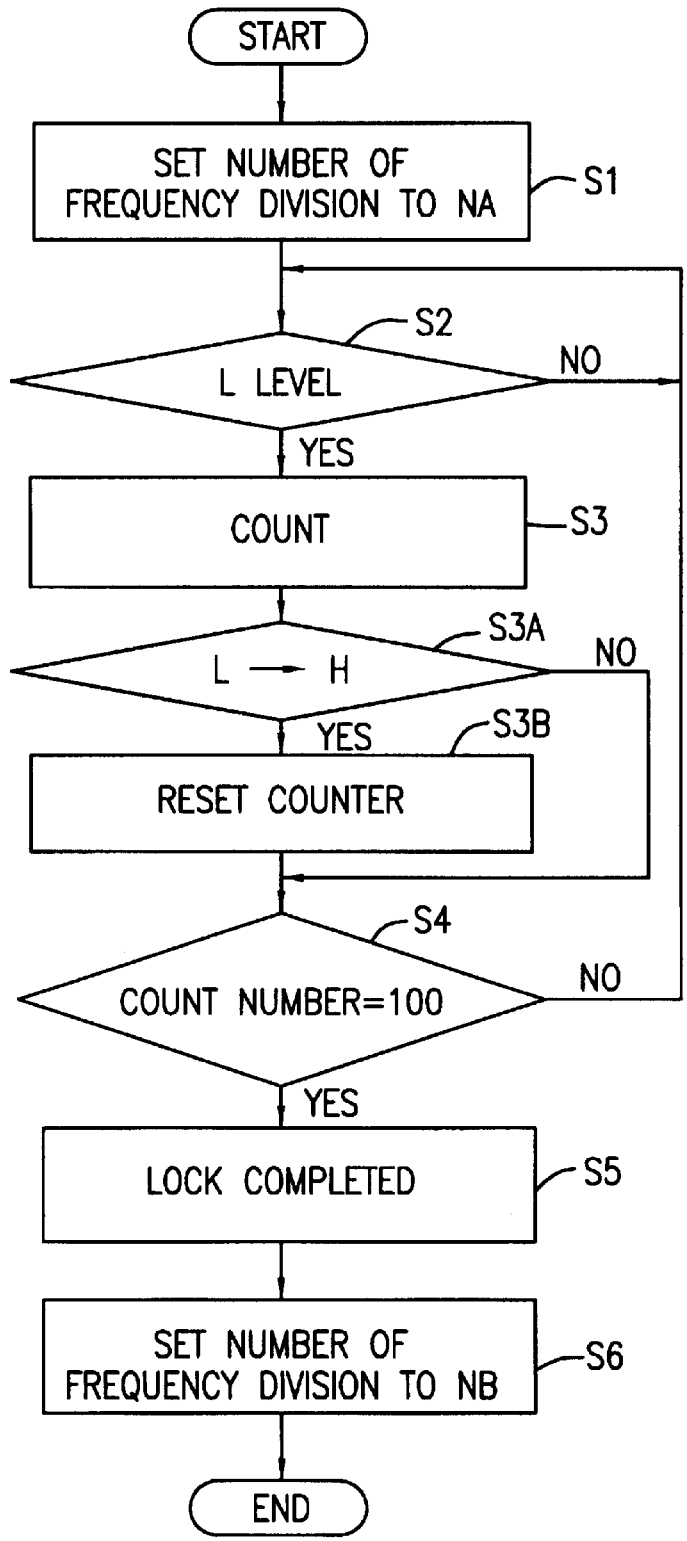
FIG. 3 is a flow chart explaining a series of processes in the operation of a lock detection section 8.

FIG. 3 is a flow chart showing a series of processes in the operation of the lock detection section 8.

As shown in FIG. 3, at step S1, at the time of frequency setting initialization, the register 8A of the lock detection section 8 sets the smaller number of frequency division NA to the frequency dividers 5 and 6.

At step S2, the lock detection section 8 determines whether the output signal C from the phase comparator is a L signal or not due to the difference in polarity with respect to the output signals A1 and A0 from the variable frequency dividers 5 and 6, respectively. When the output signal C is not a L signal, the lock detection section 8 waits until it becomes a L signal.

At step S3, when output signal C is L, counter 8B proceeds to count the clock transitions of clock 7. At step 3A, however, if the output signal C changes from a L signal to a H signal, the counter 8B at the lock detection section clears the count number in order to restart counting the clock signal from the reference oscillator 7 when output signal L again goes to L (step S3B). As long as there is no change of output signal C from L to H, counter 8B continues to count.

At step S4, the lock detection section 8 determines whether the counted number at the counter 8B has reached up to 100. Then returning back to step S2, if the output signal C is a L signal, the counting will be continued.

At step S5, when the count number reaches up to 100, the lock detection section 8 determines that locking is completed.

At step S6, the larger number of frequency division NB is set to the frequency dividers 5 and 6.

As it has been discussed above, in accordance with the present invention, two comparison frequencies are obtained as the oscillation frequency from the voltage controlled oscillator and the reference oscillation frequency from the reference oscillator are divided by the smaller number of frequency division. Then as it is detected that the polarities of the comparison frequencies have become the same, the number of frequency division is switched from the smaller one to the larger one. Consequently, the time in which the number of frequency division is small and the phase noise is bad (high) is shortened.

While the preferred embodiment of the invention have been described using specific terms, such description is for illustrative purposes only, and it is to be understood that changes and variations may be made without departing from the spirit or the scope of the following claims.

What is claimed is:

1. A phase noise reduction system of a frequency synthesizer comprising:

a first variable frequency divider for a voltage controlled oscillator which divides an oscillation frequency signal of said voltage controlled oscillator;

a second variable frequency divider for a reference oscillator which divides an oscillation frequency signal of said reference oscillator;

a lock detection section which initially sets a common first number of frequency division for said first and second variable frequency dividers, subsequently detects locking of frequency signals between said voltage controlled oscillator and said reference oscillator, and then in response to detecting said locking of frequency signals between said voltage controlled oscillator and said reference oscillator switches the setting of number of frequency division from said common first number of frequency division to a second number of frequency division, said common first number of frequency division being smaller than said second number of frequency division; wherein said lock detection section monitors a polarity of a first output signal from said first variable frequency divider for said voltage controlled oscillator and a polarity of a second output signal from said second variable frequency divider for said reference oscillator, and determines that a frequency is locked when the monitored first and second output signals have the same polarity continuously for a predetermined period of time.

2. A phase noise reduction system of a frequency synthesizer as claimed in claim 1, wherein said lock detection section measures said predetermined period of time using the reference frequency signal from said reference oscillator as a clock signal.

3. A phase noise reduction system of a frequency synthesizer as claimed in claim 1, further comprising:

an exclusive OR circuit for monitoring the polarity of the first and second output signals.

4. A phase noise reduction system of a frequency synthesizer for obtaining an arbitrary frequency oscillation, the phase noise reduction system comprising:

a reference oscillator that generates a reference frequency signal;

a voltage controlled oscillator that generates an oscillation frequency signal, the frequency of which is determined by an input DC voltage;

a first variable frequency divider for said voltage controlled oscillator which divides the oscillation frequency signal of said voltage controlled oscillator and outputs a first comparison frequency;

a second variable frequency divider for said reference oscillator which divides the reference frequency signal of said reference oscillator and outputs a second comparison frequency;

a phase comparison DC voltage generating section that generates an input DC voltage of said voltage controlled oscillator so as to reduce a phase error between said first comparison frequency from said first variable frequency divider and said second comparison frequency from said second variable frequency divider; and a lock detection section which initially sets a common first number of frequency division for said first and second variable frequency dividers, subsequently detects locking of frequency signals between said voltage controlled oscillator and said reference oscillator, and then in response to detecting said locking of frequency signals between said voltage controlled oscillator and said reference oscillator switches the setting of number of frequency division from said common first number of frequency division to a second number of frequency division, said common first number of frequency division being smaller than said second number of frequency division, wherein said lock detection section monitors a polarity of a first output signal from said first variable frequency divider for said voltage controlled oscillator and a polarity of a second output signal from said second variable frequency divider for said reference oscillator, and determines that a frequency is locked when the monitored first and second output signals have the same polarity continuously for a predetermined period of time.

5. A phase noise reduction method of a frequency synthesizer for obtaining an arbitrary frequency oscillation by locking an oscillation frequency signal of a voltage controlled oscillator to a reference oscillation frequency signal of a reference oscillator, the phase noise reduction method comprising:

initially frequency-dividing the oscillation frequency signal of said voltage controlled oscillator by a first variable frequency divider and the reference oscillation frequency signal of said reference oscillator by a second variable frequency divider, respectively, by a common first number of frequency division;

monitoring a polarity of a first output signal from said first variable frequency divider and a polarity of a second output signal from said second variable frequency divider, detecting a lock of said frequencies being frequency-divided when the monitored first and second output signals have the same polarity continuously for a predetermined period of time; and in response to detecting the lock of said frequencies being frequency divided, switching the frequency division by said first number of frequency division to frequency division by a second number of frequency division, said common first number of frequency division being smaller than said second number of frequency division.

* * * * *